(12) United States Patent
Yang

(10) Patent No.: US 6,410,442 B1
(45) Date of Patent: Jun. 25, 2002

(54) MASK-LESS DIFFERENTIAL ETCHING AND PLANARIZATION OF COPPER FILMS

(75) Inventor: Kai Yang, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 3 days.

(21) Appl. No.: 09/640,187

(22) Filed: Aug. 17, 2000

Related U.S. Application Data

(60) Provisional application No. 60/149,428, filed on Aug. 18, 1999.

(51) Int. Cl.$^7$ ................................................ H01L 21/00
(52) U.S. Cl. ..................... 438/692; 216/38; 216/88; 216/92; 216/105; 438/745; 438/754; 438/748
(58) Field of Search .................. 438/692, 745, 438/748, 669, 672; 216/38, 88, 91, 92, 100, 105

(56) References Cited

U.S. PATENT DOCUMENTS

| 4,876,223 A | * | 10/1989 | Yoda et al. | 438/754 X |
| 6,074,949 A | * | 6/2000 | Schonauer et al. | 438/754 X |
| 6,083,840 A | * | 7/2000 | Mravic et al. | 438/754 X |

* cited by examiner

Primary Examiner—William A. Powell

(57) ABSTRACT

In-laid metallization patterns of copper or a copper alloy are fabricated by a damascene-type process wherein the upper surface of a thick, electroplated copper or copper alloy blanket or overburden layer filling recesses in a substrate surface is subjected to a mask-less, chemically-based differential etching step for partially planarizing/thickness reduction prior to a step of planarization by chemical-mechanical polishing (CMP). The inventive process enables an increase in manufacturing throughput, reduction in cost, and reduction in spent CMP slurry generation.

23 Claims, 3 Drawing Sheets

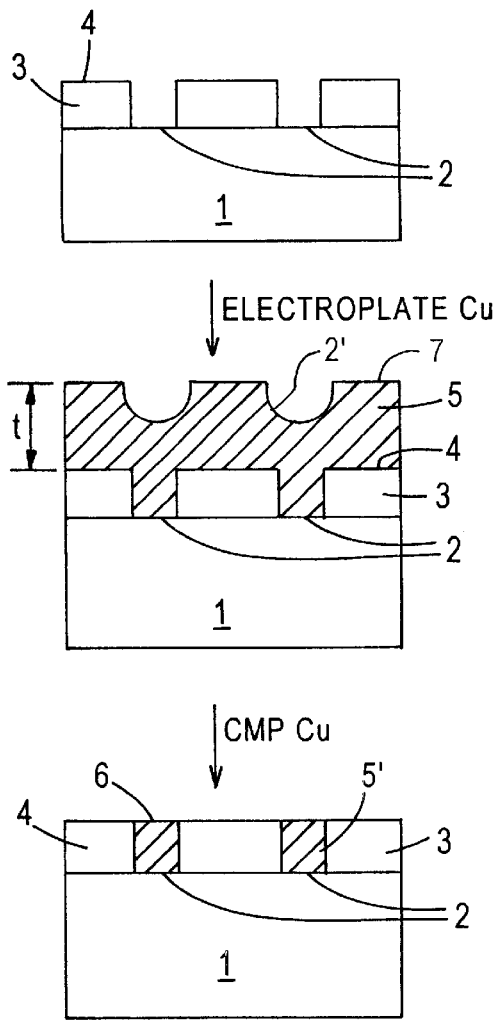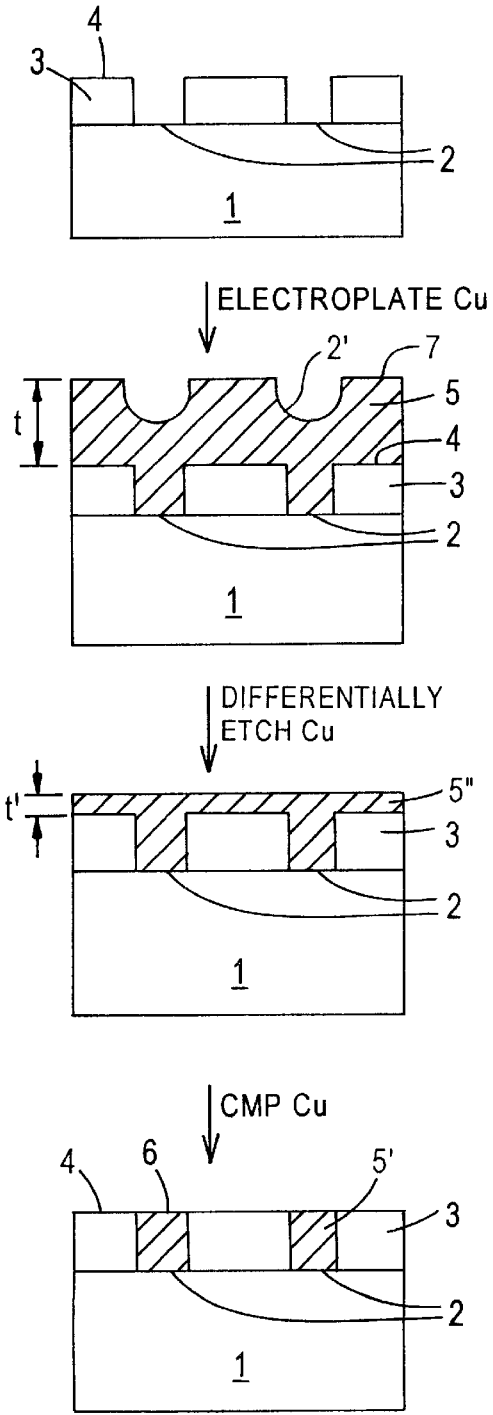

US 6,410,442 B1

MASK-LESS DIFFERENTIAL ETCHING AND PLANARIZATION OF COPPER FILMS

RELATED APPLICATION

This application claims priority from Provisional Application No. 60/149,428 filed on Aug. 18, 1999 entitled "MASK-LESS DIFFERENTIAL ETCHING AND PLANARIZATION OF COPPER FILMS", the entire disclosure of which is incorporated by referenced herein.

FIELD OF THE INVENTION

The present invention relates to a mask-less method of differentially chemically etching the surfaces of recess-patterned copper-based films or layers for providing at least partial planarization thereof. More particularly, the present invention relates to a method for forming a layer of copper or copper-based alloy filling a plurality of spaced apart recesses formed in the surface of a substrate, wherein the exposed upper surface of the layer is substantially coplanar with non-recessed areas of the substrate. Even more particularly, the present invention relates to a method for performing "back-end" metallization of semiconductor high-speed integrated circuit devices having submicron design features and high conductivity interconnect features, which method facilitates full planarization of the metallized surface by chemical-mechanical polishing (CMP), increases manufacturing throughput, and reduces fabrication cost.

BACKGROUND OF THE INVENTION

The present invention relates to a mask-less differential chemical etching method useful in processing copper or copper-based films as part of metallization processing of particular utility in integrated circuit semiconductor device and circuit board manufacture, and is especially adapted for use in processing employing "damascene" (or "in-laid") technology.

The escalating requirements for high density and performance associated with ultra large-scale integration (ULSI) semiconductor device wiring are difficult to satisfy in terms of providing submicron-sized (e.g., below 0.18 $\mu$m), low RC time constant metallization patterns, particularly wherein the submicron-sized metallization features such as vias, contact areas, grooves, trenches, etc., have high aspect (i.e., depth-to-width) ratios due to microminiaturization.

Semiconductor-devices of the type contemplated herein typically comprise a semiconductor wafer substrate, usually of doped monocrystalline silicon, and a plurality of sequentially formed dielectric interlayers and conductive patterns formed therein and/or therebetween. An integrated circuit is formed therefrom containing a plurality of patterns of conductive lines separated by interwiring spacings, and a plurality of interconnect lines, such as bus lines, bit lines, word lines, and logic interconnect lines. Typically, the conductive patterns of vertically spaced apart metallization layers are electrically interconnected by a vertically oriented conductive plug filling a via hole formed in the dielectric layer separating the layers, while another conductive plug filling a contact area hole establishes electrical contact with an active region, such as a source/drain region, formed in or on the semiconductor substrate. Conductive lines formed in groove or trench-like openings in overlying dielectric layers extend substantially parallel to the semiconductor substrate. Semiconductor devices of such type fabricated according to current technology may comprise five or more levels of such metallization in order to satisfy device geometry and miniaturization requirements.

Electrically conductive films or layers of the type contemplated herein for use in e.g., "backend-end" semiconductor manufacturing technology as required for fabrication of devices as above described typically comprise a metal such as titanium, tungsten, aluminum, chromium, nickel, cobalt, silver, gold, copper, and their alloys. In use, each of the recited metals presents advantages as well as drawbacks. For example, aluminum (Al) is relatively inexpensive, exhibits low resistivity, and is relatively easy to etch. However, in addition to being difficult to deposit by lower cost, lower temperature, more rapid "wet" technology processes such as electrodeposition, step coverage with aluminum is poor when the metallization features are scaled down to submicron size, resulting in decreased reliability of interconnections, high current densities at certain locations, and increased electromigration. In addition, low dielectric constant ("low k") materials, e.g., polyamides, when employed as dielectric interlayers, create moisture/bias reliability problems when in contact with aluminum.

The use of via-plugs filled with tungsten (W) may alleviate several of the above-described problems/drawbacks associated with aluminum. However, most W-based processes are complex and expensive, primarily due to the refractory nature of W. In addition, the relatively high resistivity of W may cause high Joule heating which can undesirably enhance electromigration of aluminum in adjacent wiring. Moreover, W plugs are susceptible to void formation therein and high contact resistance at the interface with the aluminum wiring layer.

Copper (Cu) and Cu-based alloys are particularly attractive for use in large-scale integration (LSI), very large-scale integration (VLSI), and ultra large-scale integration (ULSI) devices requiring multi-level metallization systems for "back-end" processing of the semiconductor wafers on which the devices are based. Cu and Cu-based metallization systems have very low resistivities, i.e., significantly lower than that of W and even lower than those of previously preferred systems utilizing Al or Al-based alloys, as well as significantly higher resistance to electromigration. Moreover, copper and its alloys enjoy a considerable cost advantage over a number of the above-enumerated metals, notably silver and gold. Also, in contrast to Al and the refractory type metals such as W, Ti and Ta, copper and its alloys can be readily deposited at low temperatures in good quality, bright layer form by well-known electroplating techniques, at deposition rates fully compatible with the requirements of device manufacturing throughput.

In addition to convenient, relatively low cost, low temperature, high manufacturing throughput "wet" deposition by electroplating, copper and its alloys are readily amenable to low-cost, high throughput "wet" deposition by "electroless" plating of high quality films for efficiently filling recesses such as vias, contact areas, grooves, and trenches forming interconnection routing. Such electroless plating generally involves the controlled autocatalytic deposition of a film of copper or an alloy thereof on a catalytic surface by interaction with a solution containing at least a copper salt and a chemical reducing agent, whereas electroplating comprises employing electrons supplied to an electrode (i.e., the semiconductor wafer) from an external source (i.e., power supply) for reducing copper ions in solution and depositing the reduced metal atoms obtained thereby on the electrode surface. In either case, a nucleation/seed layer is required for catalytic/deposition (as in electroless plating) or electrolytic deposition (as in electroplating) on the types of substrates contemplated for use herein. Finally, while electroplating requires a continuous nucleation/seed layer, very thin and discontinuous islands of a catalytic metal may be employed with electroless plating.

As indicated above, a commonly employed method for forming "inlaid" metallization patterns such as are required for "back-end" metallization processing of semiconductor wafers employs "damascene" type technology. Generally, in such processing methodology, a recess (i.e., an opening, irrespective of shape or geometry) for forming, e.g., a via hole in a dielectric interlayer, for electrically connecting vertically separated metallization layers, is created in the dielectric interlayer by conventional photolithographic masking and etching techniques, and filled with a metal plug, typically of tungsten. Any excess conductive material (e.g., tungsten) on the surface of the dielectric interlayer is then removed by, e.g., chemical-mechanical polishing ("CMP") techniques, wherein a moving pad is biased against the surface to be polished, with the interposition of a slurry containing finely-dimensioned abrasive particles (and other ingredients) therebetween. As a result of the CMP processing, the surface of the metal plug filling the recess is coplanar with the surface of the adjacent, non-recessed surface area of the dielectric interlayer.

A variant of the above-described technique, termed "dual-damascene" processing, involves the formation of an opening comprising a lower contact or via hole section in communication with an upper groove or trench section, which opening is filled with a conductive material, typically a metal, to simultaneously form a conductive plug in electrical contact with a conductive line.

Referring now to FIG. 1, schematically shown therein in simplified cross-sectional view are the major steps in a conventional damascene processing sequence employing relatively low cost, low temperature, high manufacturing throughput copper or copper-based electroplating and CMP techniques for forming recessed "back-end" metallization patterns in a semiconductor device formed in or on a semiconductor wafer substrate 1. In a first step (shown in the uppermost drawing), the desired arrangement or pattern of conductors is initially defined as an arrangement or pattern of recesses 2 such as holes, grooves, trenches, etc., formed (as by conventional photolithographic masking and etching techniques) in the surface 4 of a dielectric layer 3 (e.g., a silicon oxide and/or nitride or an organic polymeric material) deposited or otherwise formed over the semiconductor substrate 1. In a second step (shown in the middle drawing), a layer 5 of copper or copper-based alloy is deposited by conventional electroplating techniques to fill the recesses 2. In order to ensure complete filling of the recesses 2, the copper or copper-based layer 5 is deposited as a relatively thick blanket (or "overburden") layer of excess thickness t (measured from the non-recessed upper surface 4 of the dielectric layer 3) so as to overfill the recesses 2 and cover the entire upper surface area 4 of the dielectric layer 3. In the next step (shown in the lowermost drawing), the entire excess thickness t of the metal overburden layer 5 over the surface 4 of the dielectric layer 3 is removed by a CMP process utilizing an alumina-based slurry, leaving metal portions 5' in the recesses 2 with their exposed upper surfaces 6 substantially coplanar with the non-recessed surfaces 4 of the dielectric layer 3.

The above-described conventional damascene process forms in-laid conductors 5' in the dielectric layer 3 while avoiding problems associated with other types of metallization patterning processing, e.g., blanket metal layer deposition, followed by photolithographic masking and etching and dielectric gap filling. In addition, such single or dual damascene-type processing can be performed with a variety of other types of substrates, e.g., printed circuit boards, with and/or without intervening dielectric layers, and with a plurality of metallization levels, i.e., five or more levels.

However, the use of electroplated copper or copper-based "back-end" metallization as described above has presented a number of problems. For example, the deposited copper or copper-based alloys have a significant tendency to diffuse into the underlying semiconductor substrate material, typically silicon (Si), resulting in degradation of its semiconductive properties (e.g., diffusion lengths, carrier lifetimes, etc.), as well as poor adhesion to various materials employed as dielectric interlayers, etc. As a consequence of these phenomena associated with copper-based metallurgy, it is generally necessary to provide an adhesion promoting and/or diffusion barrier layer intermediate the semiconductor substrate and the overlying copper-based metallization layer. Suitable materials for such diffusion/barrier layer include, but are not limited to, e.g., chromium, tantalum, and tantalum nitride. Any nucleation/seed layer necessary for catalyzing electroless copper deposition or supplying electrons for copper electrodeposition thereon is deposited atop the diffusion/barrier layer. Suitable materials for such nucleation/seed layer include, but are not limited to, e.g., copper or copper-based alloys and refractory metals such as titanium, tantalum, tungsten, etc.

Another drawback associated with electroplated copper or copper-based metallization, vis-a-vis metallization by physical or chemical vapor deposition techniques, is the tendency for ridge build-up over sharp corners of vias, grooves, and trenches. Thus, as previously indicated, in conventional practices utilizing electrolytic deposition of copper or copper-based conductors, a rather thick blanket or overburden layer 5, of thickness t, typically about 0.5–1.5 $\mu$m, must be deposited over the recess patterned surface of the dielectric layer 3 to ensure complete filling (i.e., overfilling) of recesses 2 such as via holes, trenches, grooves, and other variously configured openings. Moreover, the resulting surface after overfilling may be highly non-planar, with the layer thicknesses t thereof (measured from the non-recessed surface 4 of the dielectric layer 3) spanning a significant portion of the above-described range of thicknesses. More specifically, and with particular reference to the middle drawing of FIG. 1, the upper surface 7 of the relatively thick electroplated copper or copper-based overburden layer 5 includes a pattern of depressions (i.e., recesses) 2' which substantially replicates and is in vertical registry with the pattern of recesses 2 formed in the underlying dielectric layer 3.

Removal of such thick, non-planar blanket or overburden layers of copper or copper-based alloy in the subsequent CMP step for planarizing the interconnection metallization entails a number of disadvantages. For example, removal of the excess copper or copper-based alloy material by CMP is slow and expensive. Specifically, typical copper or copper alloy removal rates by CMP employing a conventional alumina-based slurry are on the order of about 2,000–3,000 Å/min. Consequently, removal of 0.5–1.5 $\mu$m thick copper-based layers can require long processing times extending up to about 5 minutes, considerably longer than that desired for good manufacturing throughput and reduced expense. In addition, removal of such thick as-deposited copper or copper-based blanket or overburden layers by CMP results in less uniform polished layers as are obtained when CMP is performed on thinner blanket or overburden layers. Such poor uniformity is generally accompanied by an increase in defects such as non-planarity ("dishing") and gouging ("erosion") between adjacent metallization lines. Yet another drawback associated with CMP of such thick overburden layers is the requirement for treatment of large volumes of waste slurry containing abrasive particles and environmentally hazardous substances such as copper ions arising from abrasion and dissolution of the copper or copper-based alloy layers during CMP processing. Finally, environmentally acceptable disposal of solid sludge containing the abrasive particles and copper ions resulting from such waste slurry treatment is difficult and expensive.

Thus, there exists a need for a method for forming in-laid electroplated copper or copper-based metallization patterns by a damascene technique which does not suffer from the problems of the conventional art, i.e., reduced manufacturing throughput, increased cost, poor uniformity, increased occurrence of defects such as "dishing" and "gouging", generation and requirement for treatment of large amounts of CMP waste slurry and sludge resulting therefrom, etc., arising from the CMP processing of thick blanket or overburden layers characteristic of copper or copper-based electroplating of recess-patterned substrates. Specifically, there exists a need for an improved electroplating and CMP-based metallization method for forming copper or copper-based "back-end" in-laid contacts and interconnection routing of active regions (e.g., transistors, diodes, etc.) and components in integrated circuit semiconductor devices. Moreover, there exists a need for an improved CMP-based method for forming such contacts, vias, and interconnect routings which is fully compatible with conventional process flow and methodology in the manufacture of such integrated circuit semiconductor devices and other devices requiring in-laid metallization patterns, e.g., circuit boards.

The present invention addresses and solves the above-described problems and drawbacks attendant upon conventional processes for manufacturing semiconductor devices utilizing electroplated copper or copper-based metallization, particularly in the reduction of the thickness of the electroplated blanket or overburden layer required to be removed by CMP processing in the formation of in-laid "back-end" contacts/metallization patterns by damascene techniques, thereby obtaining good manufacturing throughput and improved product quality.

DISCLOSURE OF THE INVENTION

An advantage of the present invention is a mask-less method for differentially etching a recess-patterned surface of a layer of copper or copper-based alloy.

Another advantage of the present invention is an abrasive-less, chemical method for at least partially planarizing a recess-patterned surface of a layer of copper or copper-based alloy.

Still another advantage of the present invention is a method of manufacturing a device with an in-laid copper or copper-based metallization pattern at lower cost and with higher manufacturing throughput than with conventional process methodology.

Yet another advantage of the present invention is a method of manufacturing an integrated circuit semiconductor device utilizing copper or copper-based "back-end" in-laid contacts and interconnections by a damascene process, with greater uniformity and planarity, improved product quality, and reduced defects.

A further advantage of the present invention is a method for forming electroplated copper or copper-based in-laid contacts by CMP at an increased speed, lower cost, and with greater planarity than obtainable with conventional CMP-based processes.

A yet further advantage of the present invention is an improved method for forming copper or copper-based in-laid contacts and metallization patterns by a damascene type CMP-based process which is fully compatible with existing process methodology.

A still further advantage of the present invention is an improved copper etchant solution for differentially etching recess-patterned surfaces of copper or copper-based layers.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are achieved in part by a method of mask-less differential etching/planarizing a recess-patterned surface of copper or copper alloy, which method comprises the sequential steps of:

(a) providing a workpiece having upper and lower opposed major surfaces, the upper major surface comprising a layer of copper or a copper alloy and including a recessed area and a non-recessed area;

(b) securing the lower major surface of the workpiece to a facing surface of a movable workpiece holder for providing movement of the workpiece in a direction parallel to the upper surface thereof;

(c) providing a source of a liquid etchant solution, the liquid etchant solution comprising:
  i. a copper or copper alloy etchant;
  ii. a surfactant in an amount sufficient for providing wetting of the copper or copper alloy surface by the etchant solution;
  iii. an additive in an amount sufficient for increasing the viscosity of the etchant solution to a preselected level greater than that of the solvent; and
  iv. a liquid solvent;

(d) directing etchant solution from the source onto the upper surface of the workpiece while moving the workpiece in a direction parallel to the upper surface, thereby at least partially filling the recessed area with etchant solution and distributing the etchant solution as a film covering the non-recessed area, the film of etchant solution being replenished with fresh etchant solution from the source at a faster rate than the etchant solution filling the recessed area; whereby the rate of etching of the copper or copper alloy within the recessed area is slower than that of the non-recessed area, resulting in differential etching of the recess-patterned surface of the layer of copper or copper alloy; and (e) continuing the differential etching of step (d) for a time sufficient to reduce the thickness of the non-recessed area of the copper or copper alloy layer to a preselected thickness, thereby at least partially planarizing the upper surface.

In embodiments according to the invention, the etchant solution is provided as an aqueous solution at a temperature of about 20–50° C. and comprising:

i. a copper or copper alloy etchant comprising about 10 to about 20% hydrogen peroxide ($H_2O_2$) and about 0.2 to about 2% of an organic acid selected from the group consisting of citric acid, oxalic acid, and phthalic acid;

ii. a water-soluble surfactant selected from the group consisting of cationic, anionic, non-ionic, and bi-polar surfactants, in an amount sufficient for providing the desired wetting, such that etchant solution fills the recessed area and aids in retaining the etchant solution therein during workpiece motion;

iii. a water-soluble monomeric or polymeric glycol selected from the group consisting of ethylene glycols, propylene glycols, glycerols, polyethylene glycols, and polypropylene glycols, in an amount sufficient to provide the solution with a preselected viscosity greater than that of water at the same temperature, whereby loss of etchant solution flowing outwardly from the recessed area during workpiece motion is reduced; and iv. balance water as solvent.

According to embodiments of the present invention, the workpiece is provided with rotational, oscillatory, or orbital motion during step (b). In the case of rotational motion, the workpiece is rotated around a central axis perpendicular to the upper surface at at least 1,000 rpm.

In preferred embodiments according to the present invention, the upper surface of the copper or copper alloy layer comprises a patterned plurality of spaced apart recessed areas of different widths and/or depths, with non-recessed areas therebetween, and the workpiece further comprises a semiconductor wafer substrate having a dielectric layer thereon and underlying the copper or copper alloy layer, the patterned plurality of recesses in the copper or copper alloy layer being in vertical registry with a corresponding patterned plurality of recesses of different widths and/or depths formed in the underlying dielectric layer, the latter-mentioned plurality of recesses forming electrical contact areas, vias, interlevel metallization, and/or interconnection routing of at least one active device region or component of the semiconductor wafer.

In further preferred embodiments according to the present invention, the semiconductor wafer substrate comprises silicon and an adhesion promoting and/or diffusion barrier layer selected from chromium, tantalum, and tantalum nitride is provided at interfaces between the dielectric layer and the copper or copper alloy layer.

According to yet another preferred embodiment, the inventive method comprises the further step (f) of substantially fully planarizing the differentially etched upper surface of step (e) by chemical-mechanical polishing (CMP), as by the use of an alumina-based slurry.

According to another aspect of the invention, a method of manufacturing a semiconductor device comprises the sequential steps of:

(a) providing a substrate comprising a semiconductor wafer having formed thereon a dielectric layer having a surface comprising a recessed area and a non-recessed area;

(b) depositing, by electroplating, a layer of copper or copper alloy over the surface of the dielectric layer, the copper or copper alloy layer overfilling the recessed area and including a blanket or overburden layer covering the non-recessed area to a preselected first thickness, the surface of the copper or copper alloy layer including a recessed area and a non-recessed area in substantial vertical registry with corresponding ones of the underlying dielectric layer;

(c) reducing the thickness of the blanket or overburden layer by a mask-less, differential chemical etching process to a second thickness; and (d) chemical-mechanical polishing the remaining second thickness of the blanket or overburden layer to (1) substantially remove same from the surface of the non-recessed area of the dielectric layer and (2) render the exposed upper surface of the portion of the copper or copper alloy layer filling the recessed area of the dielectric layer substantially coplanar with the surface of the non-recessed area of the dielectric layer.

In embodiments according to the invention, the semiconductor substrate comprises a silicon wafer having upper and lower opposed major surfaces; the dielectric layer is formed on the upper major surface and includes a patterned surface comprising a plurality of spaced apart recessed areas with non-recessed surface areas therebetween; the copper or copper alloy layer is electroplated over the patterned surface so as to overfill each of the recessed areas and to cover each of the non-recessed areas with the blanket or overburden layer, the surface of the copper or copper alloy layer including a pattern of recessed areas with non-recessed surface areas therebetween in substantial vertical registry with the corresponding pattern of recessed areas and non-recessed areas of the underlying dielectric layer; the lower major surface of the wafer is secured to a facing surface of a movable wafer holder for moving the wafer in a direction parallel to the upper surface thereof; a source of a liquid etchant solution is provided, the liquid etchant solution comprising a copper or copper alloy etchant, a surfactant in an amount sufficient for providing wetting of the copper or copper alloy surface by the etchant solution, an additive in an amount sufficient for increasing the viscosity of the etchant solution to a preselected level greater than that of the solvent, and a liquid solvent; the etchant solution from said source is directed onto the upper surface of the wafer while moving the wafer in a direction parallel to the upper surface (as by rotating at at least 1,000 rpm about a central axis perpendicular to the upper surface), thereby at least partially filling each of the plurality of recessed areas with etchant solution and distributing the etchant solution as a film covering the non-recessed areas, the film of etchant solution being replenished with fresh etchant solution from the source at a faster rate than the etchant solution filling the recessed areas, whereby the rate of etching of the copper or copper alloy within the recessed areas is slower than that of the non-recessed areas, resulting in differential etching of the recess-patterned surface of the layer of copper or copper alloy; continuing the differential etching for a time sufficient to reduce the first thickness of the blanket or overburden layer to the preselected second thickness; and performing CMP of the remaining second thickness (as by use of an alumina-based abrasive slurry) of the blanket or overburden layer to substantially remove same from the surfaces of the non-recessed areas of the dielectric layer and render the exposed upper surfaces of the copper or copper alloy layer portions filling the recessed areas of the dielectric layer substantially coplanar with the non-recessed surface areas of the dielectric layer.

In further embodiments according to the present invention, the plurality of recessed areas of the dielectric area are provided with different widths and/or depths for forming electrical contact areas, vias, interlevel metallization, and/or interconnection routing of at least one active device region or component of the wafer; the dielectric layer is provided with an adhesion promoting and/or diffusion barrier layer selected from chromium, tantalum, and tantalum nitride and and an overlying nucleation/seed layer selected from refractory metals, copper, and copper-based alloys prior to electroplating of the copper or copper alloy layer thereon; the preselected first thickness of the copper or copper alloy blanket or overburden layer is from about 0.5 $\mu$m to about 1.5 $\mu$m, and the preselected second thickness thereof after differential etching is less than about 5,000 Å.

According to yet another aspect according to the present invention, a liquid etchant solution for use in mask-less differential etching of recess-patterned copper or copper alloy layers comprises:

i. a copper or copper alloy etchant;
ii. a surfactant in an amount sufficient for providing wetting of copper or copper alloy surfaces by the etchant solution;
iii. an additive in an amount sufficient for increasing the viscosity of the etchant solution to a preselected level greater than that of the solvent; and
iv. a liquid solvent.

In embodiments according to the invention, the copper or copper alloy etchant comprises about 10 to about 20% hydrogen peroxide ($H_2O_2$) and about 0.2 to about 2% of an organic acid selected from citric acid, oxalic acid, and phthalic acid; the surfactant is water-soluble, is selected from cationic, anionic, non-ionic, and bi-polar surfactants, and is present in an amount such that the solution wets and fills recesses in the surface of the copper or copper alloy; the additive is water-soluble, comprises a monomeric or polymeric glycol selected from ethylene glycols, propylene glycerols, polyethylene glycols, and polypropylene glycols, and is present in an amount sufficient to provide the solution with a viscosity greater than that of water at the same temperature, whereby loss of etchant solution from recessed areas of the copper or copper alloy layer during motion thereof is reduced; and balance water as solvent.

According to still another aspect according to the present invention, silicon semiconductor integrated circuit devices comprising copper or copper-based "back-end" metallization patterns formed by the inventive method are provided.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will be described and become apparent, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the present invention can best be understood when read in conjunction with the following drawings, wherein:

FIG. 1 illustrates, in simplified, cross-sectional schematic form, a sequence of steps for performing a damascene type copper electroplating and CMP process according to conventional practices;

FIG. 2 illustrates, in simplified, cross-sectional form, a sequence of steps for performing a damascene type copper electroplating and CMP process according to an embodiment of the present invention;

DESCRIPTION OF THE INVENTION

Figure 3:
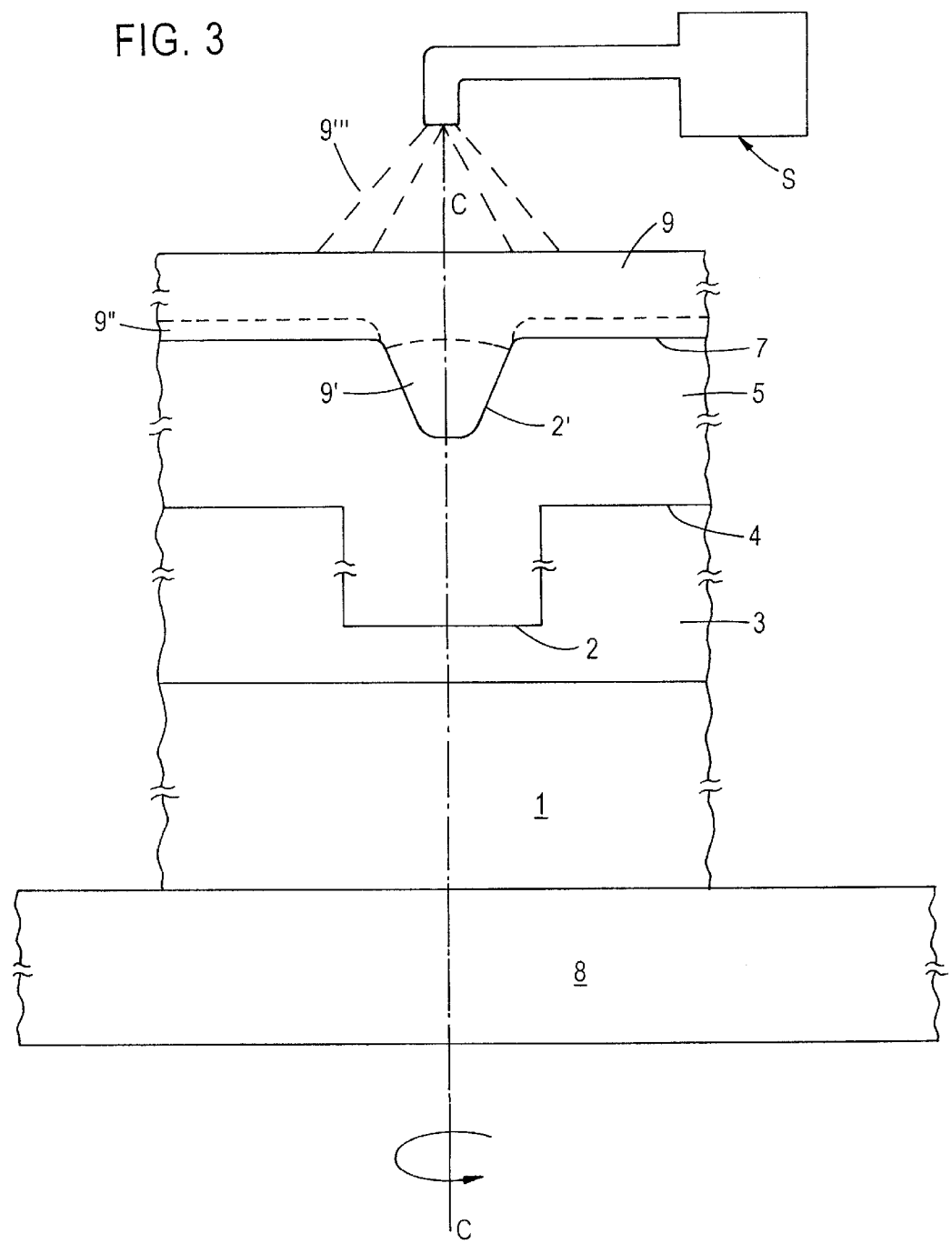
FIG. 3 illustrates, in simplified, cross-sectional form, an enlarged view of a portion of a wafer-type workpiece subjected to mask-less differential etching according to an embodiment of the present invention.

The present invention addresses and solves problems arising from manufacturing semiconductor devices comprising in-laid "back-end" metallization patterns, wherein, as part of the fabrication methodology, a plurality of recesses formed in the surface of a dielectric layer overlying a semiconductor substrate are filled with copper or a copper alloy by an electroplating process, followed by removal of excess copper or copper alloys by CMP for rendering the surfaces of the in-laid metallization pattern coplanar with the non-recessed surface(s) of the dielectric layer. More specifically, the present invention advantageously provides for mask-less, differential etching of a significant portion of the excess copper or copper alloy layer thickness prior to CMP processing, resulting in reduced processing time, greater planarity, reduced defects, and substantially reduced volumes of waste CMP slurry and sludge requiring expensive treatment for environmentally acceptable disposal. In addition, the inventive method is fully compatible with other aspects of existing processing methodology and provides increased manufacturing throughput vis-a-vis conventional damascene-type copper-electroplating and CMP processing.

Briefly stated, according to the present invention, the pattern of recesses formed in the surface of the thick electroplated copper or copper alloy layer (i.e., blanket or overburden layer) required for ensuring complete filling of the recesses, which pattern substantially replicates the recess pattern of the underlying dielectric layer, is advantageously utilized for performing a mask-less, differential chemical etching process for reducing the thickness of the blanket or overburden layer prior to planarization by CMP processing. The overall time for planarization is thus reduced and problems attendant upon CMP processing of thick copper or copper alloy layers are avoided, resulting in greater uniformity and planarization, with reduced occurrence of defects such as "dishing" or "gouging".

The method of the present invention is performed by supplying a liquid etchant to the recess-patterned surface to be differentially etched, while moving the surface at a relatively high speed in a direction parallel to the surface. The etchant solution at least partially fills the recess(es) and is distributed (by spreading) over the non-recessed surface (s). The inventive method utilizes a novel etchant solution containing several components selected for performing specific functions necessary for obtaining differential etching of recess-patterned surfaces.

Specifically, the etchant solution comprises (1) at least one chemical etchant for copper or copper alloys; (2) a surfactant for providing wetting of copper or copper alloy surfaces by the etchant solution, thereby aiding in retention of the etchant solution within the recess when the surface is subjected to rapid motion in a direction parallel to the surface; (3) an additive for increasing the viscosity of the etchant solution to a level greater than that of the solvent alone at the same temperature, thereby also aiding in retention of the etchant solution within the recess during the above-described motion and further reducing the loss of etchant solution from the non-recessed surface area during said motion as a result of inertial (e.g., centrifugal) forces caused by said motion; and (3) a solvent, typically water.

In operation, the combination of surface wetting and increased viscosity of the etchant solution results in relative immobilization or entrapment of the etchant solution in the recess(es), resulting in a very low rate of replenishment of spent etchant solution with fresh etchant solution from the etchant solution source, compared to the non-recessed areas where immobilization/entrapment does not occur. That is, at the non-recessed surface area(s), a balance is reached between removal of spent etchant solution by e.g., centrifugal force in the case of wafer rotation, and replenishment with fresh etchant from the etchant solution source. As a consequence, the rate of etching within the recessed area(s) rapidly decreases relative to when the etchant is initially supplied, due to consumption and lack of replenishment of the active etchant components, whereas etching of the non-recessed surface area(s) proceeds at a substantially constant rate due to continuous replenishment of the active etchant component.

In this regard, it is also significant to recognize an additional benefit provided by the viscosity-increasing additive. Specifically, the viscosity-increasing additive (1) reduces the rate at which the etchant solution is removed from the non-recessed areas as a result of inertial (e.g., centrifugal) forces, thereby allowing for a longer period of contact with the non-recessed surface area(s) for etching thereof, and (2) reduces the volume of etchant solution required for performing a requisite amount of etching.

Referring now to the uppermost two drawings of FIG. 2, shown therein, for illustrative purposes only, is a portion of a semiconductor wafer substrate 1, typically of monocrystalline silicon containing at least one active device region therein or as part of an epitaxial layer formed thereon. It is to be understood that the principles of the present invention are equally applicable to a variety of other types of substrates, e.g., resin-containing laminates such as are used for fabricating circuit boards and substrates for discrete electrical components such as thin film transistors, diodes, resistors, capacitors, etc.

As illustrated, a dielectric layer 3 having a pattern comprising a plurality of recesses 2 formed therein (which recesses may be of different widths and/or depths) with a plurality of non-recessed surfaces 4 therebetween is present on the surface of the semiconductor wafer substrate 1. The dielectric layer 3 and patterned plurality of recesses formed therein may be formed by any convenient method such as photolithographic masking and etching, the details of which are conventional and, hence, not set forth herein in detail. Typical dimensions of recesses 2 include depths of from about 0.25 μm to about 2.0 μm and widths of from about 0.1 to about 10 μm, depending upon the specific shape and function of the particular metallization feature.

In the next process step, a layer 5 of copper or copper alloy metallization material, is blanket deposited over the patterned dielectric layer 3, in conventional fashion utilizing well-known electroplating techniques not described herein for brevity, so as to fill the recesses 2 formed therein. As in the conventional process illustrated in FIG. 1, in order to ensure complete filling of the recesses and provide adequate metallization conductivity, layer 5 (termed a "blanket" or "overburden" layer) is deposited in excess, i.e., so as to overfill the recesses 2 and cover the upper surfaces 4 of the non-recessed portions 4 to a first thickness t (measured from the surface of the non-recessed portions 4). In typical practice utilizing electroplated copper or copper alloys, the thickness t of overburden layer 5 is from about 0.5 μm to about 1.5 μm. However, as described above with reference to the conventional processing such as illustrated in FIG. 1, the resulting upper surface 7 of the electroplated blanket or overburden layer 5 includes a pattern of depressions or recesses 2' which substantially replicates and is in vertical registry with the pattern of recesses 2 formed in the underlying dielectric layer 3, the presence of which is used to advantage according to the method of the present invention.

As indicated previously, but not shown in the drawing for illustrative simplicity, an adhesion promoting and/or diffusion barrier layer and a nucleation/seed layer (each of a material as described above) may be sequentially formed, in conventional manner, over the surfaces of the dielectric layer 3 and the substrate 1 surfaces exposed at the bottoms of the recesses 2 prior to copper electroplating.

Referring now to the third drawing of FIG. 2, in the next step according to this embodiment, a portion of the first thickness t of the copper or copper alloy blanket or overburden layer 5 is then removed by the above-described mask-less, differential chemical etching method according to the present invention, which method provides a removal rate greater than that provided by conventional CMP processing utilizing, e.g., an alumina-based slurry, leaving a partially planarized blanket or overburden layer 5" of substantially reduced thickness t', typically less than about 5,000 Å. Any convenient technique for controlling the duration of differential etching for providing the desired residual blanket or overburden layer second thickness t' may be employed, including, but not limited to, use of a thickness detector, resistivity or conductivity monitor, or a fixed time interval for layer removal.

In an illustrative, but non-limitative example of an embodiment of the present invention, the first thickness t of a copper blanket or overburden layer of initial, as deposited (i.e., first) thickness of from about 0.5 μm to about 1.5 μm was reduced to a residual (i.e., second) thickness of about 5,000 Å at a useful removal rate by treatment according to to the inventive method, comprising employing an aqueous etchant solution at a temperature of about 20–50° C. and a wafer rotation rate of about 1,000 rpm or greater, the etchant solution comprising about 10 to about 20% hydrogen peroxide ($H_2O_2$) and about 0.2 to about 2% of an organic acid selected from citric, oxalic, and phthalic acids, a water-soluble surfactant, chosen from cationic, anionic, non-ionic, and bi-polar surfactants, in an amount sufficient to provide wetting of the copper blanket or overburden layer and retention of the etchant filling the recesses, and a water-soluble glycol for increasing the viscosity of the solution relative to that of solvent water within the temperature range of interest, such that the etchant solution within the recesses was substantially immobilized and the solution loss from the non-recessed areas was counter-balanced by supply of fresh etchant solution from the etchant solution source.

Given the present disclosure and the essential principle of the inventive method, determination of optimum types and quantities of surfactant and glycol additions to the basic aqueous copper etchant solution for use in a particular situation are considered within the ambit of one of ordinary skill. Moreover, the inventive method is not limited to providing rotational movement of the workpiece; other types of linear motion such as oscillatory motion are possible, as is orbital or planetary types of motion, so long as the essential requirement of providing motion for removal of spent etchant from and replenishment with fresh etchant solution at non-recessed areas, while inhibiting replenishment of spent etchant at recessed areas, is satisfied.

Referring now to FIG. 3, shown therein in simplified, cross-sectional form, is an enlarged view of a portion of a recess-patterned semiconductor wafer, such as illustrated in the second drawing of FIG. 2, while undergoing mask-less differential chemical etching according to the method of the invention. Specifically, semiconductor wafer substrate 1 is illustrated as fixed at its lower surface to a rotatable wafer mount 8 for rotation about central axis c—c, and etchant solution film 9 at least partially fills recess 2' in copper or copper alloy blanket or overburden layer of first thickness t, with the etchant solution filling and being retained within the recess 2 due to the wetting action provided by the surfactant component of the etchant solution 9. Etchant solution 9' within the recess 2' is effectively immobilized due to the combination of surface wetting and increased viscosity due to the viscosity increasing component, whereas etchant solution lost from from etchant film 9" over the non-recessed surface areas 7 of the copper or copper alloy blanket or overburden layer 5 due to radially outwardly directed centrifugal force is constantly replenished with fresh etchant solution 9''' from etchant source S. In practice, differential etching proceeds, as described above, until a thickness of the blanket or overburden layer 5 substantially corresponding to the depth of the recesses 2' is removed, resulting in at least partial planarization. If necessary, non-selective etching of the planarized surface may continue for further reducing the blanket or overburden layer thickness to the desired second or residual thickness t', as shown in the figure.

Returning now to the bottom-most drawing of FIG. 2 illustrating the final step of the inventive method, the residual blanket or overburden layer 5" of thickness t' is removed by CMP performed in a conventional manner, whereby in-laid metallization pattern 5' is obtained with the exposed upper surfaces 6 thereof substantially coplanar with the non-recessed surfaces 4 of the dielectric layer 3. In an illustrative, but non-limitative embodiment of the invention, the residual copper or copper alloy blanket or overburden layer 5" of second thickness t' was removed by conventional CMP utilizing an alumina-based slurry at a removal rate of about 2,000–3,000 Å/min., i.e., in about a 2 minute interval.

Figure 4:
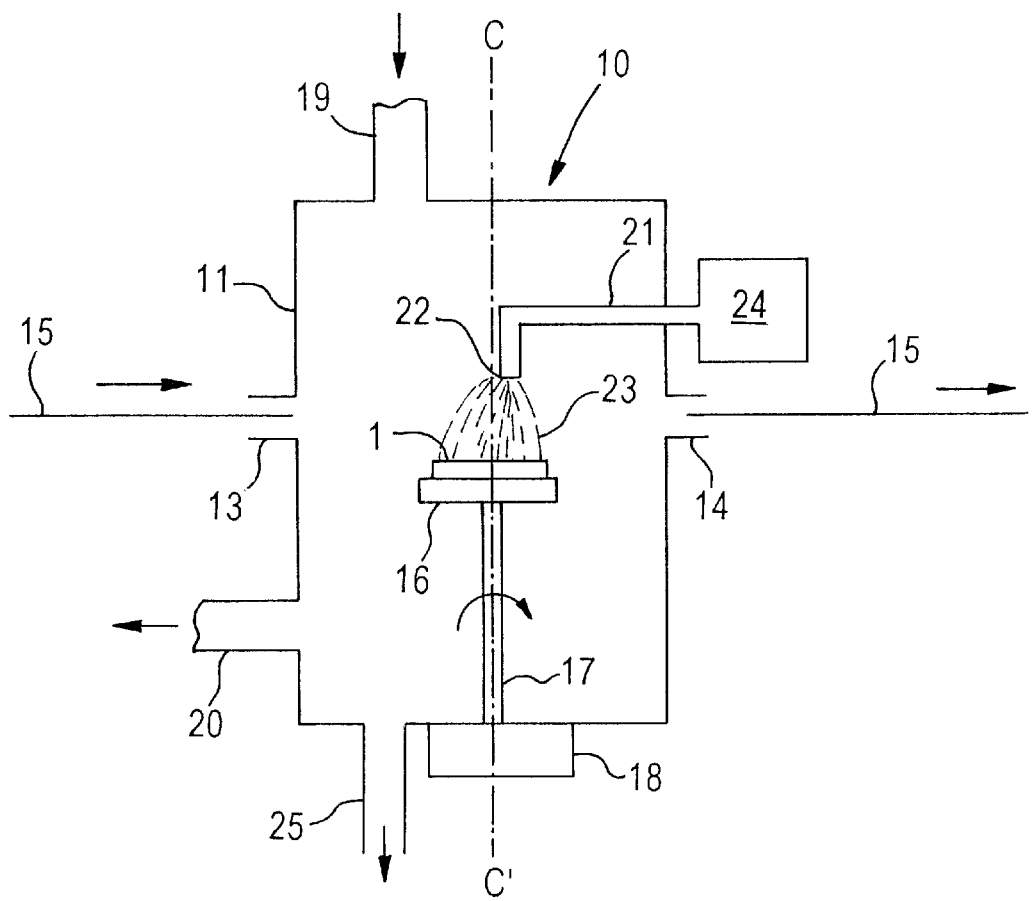
FIG. 4 illustrates, in simplified, cross-sectional form, an in-line type apparatus for performing mask-less differential etching according to an embodiment of the present invention.

FIG. 4 illustrates, in simplified, cross-sectional form, an illustrative, but non-limitative example of an in-line type apparatus 10 suitable for performing mask-less differential etching of e.g., semiconductor wafers, according to an embodiment of the present invention. Apparatus 10, when adapted for use as part of a continuous manufacturing line such as is conventional in semiconductor manufacture, comprises a chamber 11 having entrance and exit apertures 13 and 14, respectively, at opposite sides thereof for receiving and discharging substrates 1 supplied thereto and removed therefrom by a transfer mechanism 15 of conventional design. Chamber 11 includes a support 16 (optionally heatable) for mounting thereon a semiconductor wafer substrate, e.g., such as 1 illustrated in FIGS. 1–3. The support 16 is mounted on a rotatable shaft 17 which is coupled to a motor 18 for rotating wafer workpiece 1 about a central axis c–c' perpendicular to the surface of the wafer. The chamber 11 may also be optionally provided with a gas inlet 19 and a gas outlet 20, for respectively supplying and exhausting a desired gas atmosphere.

Mounted above the wafer workpiece 1, in general alignment with rotational axis c–c', is the outlet or nozzle 22 of an etchant supply conduit 21, schematically shown in the drawing, for supplying a stream or spray of liquid etchant solution 23 from etchant source 24 in a central area of the wafer workpiece surface. Spent etchant solution lost from the wafer surface due to the action of centrifugal force is removed from chamber 11 via drain conduit 25 located in the bottom chamber wall.

Thus, the present invention enables the formation of reliable, defect-free, highly planar, in-laid copper or copper-based metallization patterns for forming contacts and interconnections, by providing a method for mask-less differential etching of thick copper or copper alloy blanket or overburden layers deposited by electroplating as part of damascene-type "back-end" processing of integrated circuit semiconductor devices. The inventive process effects a substantial increase in manufacturing throughput by reducting the time and cost of CMP processing by rapidly and efficiently removing a substantial portion of the blanket or overburden by a mask-less differential etching step performed prior to final planarization processing by CMP techniques. In addition, the inventive method is equally applicable for use in dual-damascene type processing and is fully compatible with existing "back-end" processing methodology. Finally, the inventive method advantageously decreases and waste slurry and sludge generation associated with conventional planarization processing employing CMP.

The present invention is applicable to the formation of various types of in-laid metallization patterns, illustratively, but not limited to, the manufacture of semiconductor devices having submicron metallization features and high aspect ratio openings. The invention is also particularly well suited to the manufacture of circuit boards and other types of electronic devices and/or components.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method for mask-less differential etching/planarizing a recess-patterned surface of a layer of copper or copper alloy, which method comprises the sequential steps of:

(a) providing a workpiece having upper and lower opposed major surfaces, the upper major surface comprising a layer of copper or copper alloy and including a recessed area and a non-recessed area;

(b) securing the lower major surface of said workpiece to a facing surface of a movable workpiece holder for providing movement of the workpiece in a direction parallel to said upper surface;

(c) providing a source of a liquid etchant solution, said etchant solution comprising:
  i. at least one copper or copper alloy etchant;
  ii. a surfactant in an amount sufficient for providing wetting of the copper or copper alloy surface by the etchant solution;
  iii. an additive in an amount sufficient for increasing the viscosity of the etchant solution to a level greater than that of the solvent; and
  iv. a liquid solvent;

(d) directing etchant solution form said source onto said upper surface of said workpiece while moving the workpiece in a direction parallel to said upper surface, thereby at least partially filling the recessed area with etchant solution and distributing said etchant solution as a film covering the non-recessed area, said film of etchant solution being replenished with fresh etchant solution from said source at a faster rate than the etchant solution filling the recessed area; whereby the rate of etching of the copper or copper alloy within the recessed area is slower than that of the non-recessed area, resulting in differential etching of the recess-patterned surface of the layer of copper or copper alloy; and (e) continuing the differential etching of step (d) for a time sufficient to reduce the thickness of the non-recessed area of the copper or copper alloy layer, thereby at least partially planarizing said upper surface.

2. The method as in claim 1, comprising providing an aqueous etchant solution at a temperature of about 20–50° C., said solution consisting essentially of:

i. a copper of copper alloy etchant comprising about 10 to about 20% of hydrogen peroxide ($H_2O_2$) and about 0.2 to about 2% of an organic acid selected from the group consisting of critric acid, oxalic acid, and phthalic acid;

ii. a water-soluble surfactant selected from the group consisting of cationic, anionic, non-ionic, and bi-polar surfactants, in an amount sufficient for providing said wetting, such that the etchant solution filling the recessed area is retained therein during workpiece motion;

iii. a water-soluble monomeric or polymeric glycol selected from the group consisting of ethylene glycols, propylene glycols, glycerols, polyethylene glycols, and polypropylene glycols, in an amount sufficient to provide said solution with a viscosity greater than that of water at the same temperature, whereby loss of etchant solution flowing outwardly from the recessed area during workpiece motion is reduced; and iv. balance water as solvent.

3. The method as in claim 1, comprising providing rotational, oscillatory, or orbital motion of said workpiece during step (d).

4. The method as in claim 3, comprising rotating the workpiece around a central axis perpendicular to said upper surface at at least about 1,000 rpm.

5. The method as in claim 1, wherein the upper surface of said copper or copper alloy comprises a patterned plurality of spaced apart recessed areas with non-recessed areas therebetween.

6. The method as in claim 5, comprising providing a workpiece comprising a semiconductor wafer substrate having a dielectric layer thereon and underlying said copper or copper alloy layer, said patterned plurality of recesses in said copper or copper-based alloy layer being in vertical registry with a corresponding patterned plurality of recesses formed in said underlying dielectric layer.

7. The method as in claim 6, comprising providing said patterned plurality of recesses in said dielectric layer as at least electrical, contact areas, vias, interlevel metallization, or interconnection routing of least one active device region or component of said semiconductor wafer.

8. The method as in claim 6, comprising providing a silicon semiconductor wafer substrate and further providing a layer selected from chromium, tantalum, and tantalum nitride at interfaces between said dielectric layer and said copper or copper alloy layer.

9. The method as in claim 6, comprising the further step (f) of substantially fully planarizing the differentially etched upper surface of step (e) by chemical-mechanical polishing.

10. The method as in claim 9, comprising performing said chemical-mechanical polishing utilizing an alumina-based slurry.

11. A method of manufacturing a semiconductor device, which method comprises the sequential steps of:

providing a substrate comprising a semiconductor having formed thereon a dielectric layer having a surface comprising a recessed area and a non-recessed area;

depositing, by electroplating, a layer of copper or copper alloy over the surface of the dielectric layer, the copper or copper layer overfilling the at least one recessed area and including a blanket or overburden layer covering the non-recessed area to a first thickness, the surface of the copper or copper alloy layer including a recessed area and a non-recessed area in substantial vertical registry with corresponding ones of the underlying dielectric layer;

reducing the thickness of the blanket or overburden layer by a mask-less, differential chemical etching process to a second thickness; and chemical-mechanical polishing the remaining second thickness of the blanket or overburden layer to (1) substantially remove same from the surface of the non-recessed area of the dielectric layer and (2) render the exposed upper surface of the portion of the copper or copper alloy layer filling the recessed area of the dielectric layer substantially coplanar with the surface of the non-recessed area of the dielectric layer.

12. The method as in claim 11, comprising:

(a) providing said semiconductor substrate as a wafer having upper and lower opposed major surfaces, said dielectric layer being formed on said upper major surface and including a patterned surface comprising a plurality of spaced apart recessed areas with non-recessed surface areas therebetween;

(b) electroplating said copper or copper alloy layer over said patterned surface, said copper or copper alloy layer overfilling each of said recessed areas and including said blanket or overburden layer covering the non-recessed areas to said first thickness, the surface of said copper or copper alloy layer including a pattern of recessed areas with non-recessed surface areas therebetween in substantial vertical registry with the corresponding pattern of recessed areas and non-recessed areas of the underlying dielectric layer;

(c) securing the lower major surface of said wafer to a facing surface of a movable wafer holder for providing movement of the wafer in a direction parallel to said upper surface;

(d) providing a source of a liquid etchant solution, said etchant solution comprising:

i. at least one copper or copper alloy etchant;

ii. a surfactant in an amount sufficient for providing wetting of the copper or copper alloy surface by the etchant solution;

iii. an additive in an amount sufficient for increasing the viscosity of the etchant solution to a preselected level greater than that of the solvent; and iv. a liquid solvent;

(e) directing etchant solution from said source onto said upper surface of said wafer while moving the wafer in a direction parallel to said upper surface, thereby at least partially filling each of the plurality of recessed areas with etchant solution and distributing the etchant solution as a film covering the non-recessed areas, the film of etchant solution being replenished with fresh etchant solution from said source at a faster rate than the etchant solution filling the recessed areas; whereby the rate of etching of the copper or copper alloy within the recessed areas is slower than that of the non-recessed areas, resulting in differential etching of the recess-patterned surface of the layer of copper or copper alloy;

(f) continuing said differential etching of step (e) for a time sufficient to reduce said first thickness of said blanket or overburden layer to said second thickness; and (g) performing chemical-mechanical polishing of the remaining second thickness of said blanket or overburden layer to substantially remove same from the surfaces of the non-recessed areas of the dielectric layer and render the exposed upper surfaces of the portions of the copper or copper alloy layer filling the recessed areas of the dielectric layer substantially coplanar with the non-recessed surface areas of said dielectric layer.

13. The method as in claim 12, comprising providing an aqueous etchant solution at a temperature of about 20–50° C., said solution consisting essentially of:

a copper or copper alloy etchant comprising about 10 to about 20% hydrogen peroxide ($H_2O_2$) and about 0.2 to about 2% of an organic acid selected from the group consisting of citric acid, oxalic acid, and phthalic acid;

ii. a water-soluble surfactant selected from the group consisting of cationic, anionic, non-ionic, and bi-polar surfactants, in an amount sufficient for providing said wetting, such that etchant solution filling the recessed areas is retained therein during workpiece motion;

iii. a water-soluble monomeric or polymeric glycol selected from the group consisting of ethylene glycols, propylene glycols, glycerols, polyethylene glycols, and polypropylene glycols, in an amount sufficient to provide said solution with a viscosity greater than that of water at the same temperature, whereby loss of etchant solution flowing outweardly from the recesses during workpiece motion is reduced; and iv. balance water as solvent.

14. The method as in claim 12, comprising providing rotational, oscillatory, or orbital motion of the wafer during step (e).

15. The method as in claim 14, comprising rotating the wafer around a central axis perpendicular to said upper major surface at at least about 1,000 rpm.

16. The method as claimed in claim 12, comprising providing the plurality of recessed areas in the dielectric layer for forming at least electrical contact areas, vias, interlevel metallization or interconnection routing of at least one active device region or component of said semiconductor wafer.

17. The method as in claim 16, comprising providing a silicon semiconductor wafer, and further providing a layer selected from chromium, tantalum, and tantalum nitride at interfaces between said dielectric layer and said copper or copper alloy layer.

18. The method as in claim 17, further comprising providing a nucleation/seed layer atop said adhesion/barrier layer, said nucleation/seed layer comprising a material selected from refractory metals, copper, and copper-based alloys.

19. The method as in claim 12, comprising depositing said blanket or overburden layer in step (b) to a first thickness of from about 0.5 μm to about 1.5 μm, and reducing said first thickness in step (f) to a second thickness less than about 5,000 Å.

20. The method as in claim 12, comprising performing said CMP in step (g) utilizing an alumina-based slurry.

21. A silicon semiconductor device fabricated by the method of claim 19.

22. A liquid etchant solution for use in mask-less differential etching of recess-patterned copper or copper alloy layers, comprising:

i. a copper or copper alloy etchant;

ii. a surfactant in an amount sufficient for providing wetting of copper or copper alloy surfaces by the etchant solution;

iii. an additive in an amount sufficient for increasing the viscosity of the etchant solution to a preselected level greater than that of the solvent; and iv. a liquid solvent.

23. The etchant solution of claim 22, consisting essentially of:

i. a copper or copper alloy etchant comprising about 10 to about 20% hydrogen peroxide ($H_2O_2$) and about 0.2 to about 2% of an organic acid selected from the group consisting of citric acid, oxalic acid, and phthalic acid;

ii. a water-soluble surfactant selected from the group consisting of cationic, anionic, non-ionic, and bi-polar surfactants, in an amount sufficient to provide wetting of the surface of the copper or copper alloy, such that solution filling recesses in the surface of said copper or copper alloy is retained therein during motion of said surface;

iii. a water-soluble monomeric or polymeric glycol selected from the group consisting of ethylene glycols, propylene glycols, glycerols, polyethylene glycols, and polypropylene glycols, in an amount sufficient to provide said solution with a viscosity greater than that of water at the same temperature, whereby loss of etchant solution from recessed areas of said copper or copper alloy layer during motion thereof is reduced; and iv. balance water as solvent.

* * * * *

UNITED STATES PATENT AND TRADEMARK OFFICE
CERTIFICATE OF CORRECTION

PATENT NO.    : 6,410,442 B1
DATED         : June 25, 2002
INVENTOR(S)   : Kai Yang It is certified that error appears in the above-identified patent and that said Letters Patent is hereby corrected as shown below:

Column 15,
Line 12, change "a copper of copper alloy" to -- a copper or copper alloy --;
Line 15, change "critric acid" to -- citric acid --.

Column 17,
Line 27, change "flowing outweardly" to -- flowing outwardly --.

Signed and Sealed this

Twenty-fifth Day of March, 2003

JAMES E. ROGAN
*Director of the United States Patent and Trademark Office*